(12) United States Patent
Zhang

(10) Patent No.: US 12,014,786 B2
(45) Date of Patent: Jun. 18, 2024

(54) SHIFT REGISTER, DISPLAY PANEL, AND DISPLAY DRIVE METHOD

(71) Applicants: Wuhan Tianma Micro-Electronics Co., Ltd., Wuhan (CN); Wuhan Tianma MicroElectronics Co., Ltd. Shanghai Branch, Shanghai (CN)

(72) Inventor: Mengmeng Zhang, Shanghai (CN)

(73) Assignees: Wuhan Tianma Micro-Electronics Co., Ltd., Wuhan (CN); Wuhan Tianma MicroElectronics Co., Ltd. Shanghai Branch, Shanghai (CN)

( * ) Notice: Subject to any disclaimer, the term of this patent is extended or adjusted under 35 U.S.C. 154(b) by 0 days.

(21) Appl. No.: 18/077,968

(22) Filed: Dec. 8, 2022

(65) Prior Publication Data

US 2023/0420064 A1    Dec. 28, 2023

(30) Foreign Application Priority Data

Jun. 27, 2022    (CN) .......................... 202210734501.7

(51) Int. Cl.
*G11C 19/28*    (2006.01)
*G09G 3/3266*    (2016.01)

(52) U.S. Cl.
CPC ........... *G11C 19/28* (2013.01); *G09G 3/3266* (2013.01); *G09G 2310/0286* (2013.01)

(58) Field of Classification Search
CPC ..... G09G 3/3674–3681; G09G 3/3266; G09G 2310/0286; G09G 2310/0267
See application file for complete search history.

(56) References Cited

U.S. PATENT DOCUMENTS

| | | | | |
|---|---|---|---|---|
| 11,568,781 B2* | 1/2023 | Lai | ......................... | G11C 19/28 |
| 11,580,895 B1* | 2/2023 | Zou | .......................... | G09G 3/20 |
| 11,715,408 B1* | 8/2023 | Zhang | ................... | G09G 3/2092 |
| | | | | 345/55 |
| 2020/0152127 A1* | 5/2020 | Kang | .................... | G09G 3/3225 |
| 2021/0193764 A1* | 6/2021 | Cho | ....................... | H10K 59/131 |
| 2021/0383748 A1* | 12/2021 | Choi | .................... | G09G 3/3266 |
| 2022/0199030 A1* | 6/2022 | In | ........................... | G11C 19/28 |
| 2022/0254291 A1* | 8/2022 | Lai | ........................... | G09G 3/20 |

(Continued)

FOREIGN PATENT DOCUMENTS

| | | | |
|---|---|---|---|
| CN | 105405383 A | 3/2016 | |
| CN | 112687229 A | 4/2021 | |

*Primary Examiner* — Patrick F Marinelli
(74) *Attorney, Agent, or Firm* — Anova Law Group, PLLC

(57) ABSTRACT

A shift register, a display panel, and a display drive method are provided in the present disclosure. The shift register includes an input module, configured to output a first control signal according to an input signal; a pull-down control module, configured to control a potential of a first node according to a first clock signal, a high-level signal, a low-level signal, and the first control signal; a pull-up control module, configured to control a potential of a second node according to the first clock signal, a second clock signal, the high-level signal, and the first control signal; a maintaining module, configured to pull down the potential of the first node; a pull-down output module, configured to control an output terminal of the shift register to output the low-level signal; and a pull-up output module, configured to control the output terminal of the shift register to output the high-level signal.

13 Claims, 8 Drawing Sheets

(56) References Cited

U.S. PATENT DOCUMENTS

| | | | |
|---|---|---|---|
| 2023/0154383 A1* | 5/2023 | Zou | G09G 3/22 345/55 |
| 2023/0196970 A1* | 6/2023 | Zhao | G09G 3/2092 345/204 |

* cited by examiner

SHIFT REGISTER, DISPLAY PANEL, AND DISPLAY DRIVE METHOD

CROSS-REFERENCE TO RELATED APPLICATION

This application claims the priority of Chinese Patent Application No. 202210734501.7, filed on Jun. 27, 2022, the content of which is incorporated herein by reference in its entirety.

TECHNICAL FIELD

The present disclosure generally relates to the field of electronic device technology and, more particularly, relates to a shift register, a display panel, and a display drive method.

BACKGROUND

With continuous development of science and technology, more electronic devices with display functions are widely used in people's daily life. Electronic devices may become important tools to bring great convenience to people.

A display panel is the main component of the electronic device to realize display function. An OLED (organic light-emitting diode) display panel is one of current mainstream display panels. In the OLED display panel, sub-pixels are driven by pixel circuits for picture display; and the pixel circuits need to perform scan control and provide light-emitting control signals through shift registers.

Existing shift registers have the tailing problem of output signals, which may affect the picture display quality of the display panel.

SUMMARY

One aspect of the present disclosure provides a shift register. The shift register includes an input module, configured to output a first control signal according to an input signal; a pull-down control module, configured to control a potential of a first node according to a first clock signal, a high-level signal, a low-level signal, and the first control signal; a pull-up control module, configured to control a potential of a second node according to the first clock signal, a second clock signal, the high-level signal, and the first control signal; a maintaining module, configured to pull down the potential of the first node according to the input signal, the first clock signal, the second clock signal, and the low-level signal; a pull-down output module, configured to control an output terminal of the shift register to output the low-level signal according to the potential of the first node; and a pull-up output module, configured to control the output terminal of the shift register to output the high-level signal according to the potential of the second node.

Another aspect of the present disclosure provides a display panel. The display panel includes a display array, including a sub-pixel for picture display; a pixel circuit connected to the sub-pixel, configured to generate a drive current according to a scan signal to control the sub-pixel to perform light-emitting display; and a first scan circuit, where the first scan circuit includes a shift register. The shift register includes an input module, configured to output a first control signal according to an input signal; a pull-down control module, configured to control a potential of a first node according to a first clock signal, a high-level signal, a low-level signal, and the first control signal; a pull-up control module, configured to control a potential of a second node according to the first clock signal, a second clock signal, the high-level signal, and the first control signal; a maintaining module, configured to pull down the potential of the first node according to the input signal, the first clock signal, the second clock signal, and the low-level signal; a pull-down output module, configured to control an output terminal of the shift register to output the low-level signal according to the potential of the first node; and a pull-up output module, configured to control the output terminal of the shift register to output the high-level signal according to the potential of the second node. The shift register may be connected to the pixel circuit and configured to provide the pixel circuit with the scan signal.

Another aspect of the present disclosure provides a display drive method of a display panel, where the display panel includes a sub-pixel and a pixel circuit connected to the sub-pixel. The method includes outputting a scan signal through a shift register. The shift register includes an input module, configured to output a first control signal according to an input signal; a pull-down control module, configured to control a potential of a first node according to a first clock signal, a high-level signal, a low-level signal, and the first control signal; a pull-up control module, configured to control a potential of a second node according to the first clock signal, a second clock signal, the high-level signal, and the first control signal; a maintaining module, configured to pull down the potential of the first node according to the input signal, the first clock signal, the second clock signal, and the low-level signal; a pull-down output module, configured to control an output terminal of the shift register to output the low-level signal according to the potential of the first node; and a pull-up output module, configured to control the output terminal of the shift register to output the high-level signal according to the potential of the second node. The method further includes controlling the pixel circuit to generate a drive current according to the scan signal, thereby controlling the sub-pixel to perform light-emitting display.

Other aspects of the present disclosure can be understood by those skilled in the art in light of the description, the claims, and the drawings of the present disclosure.

BRIEF DESCRIPTION OF THE DRAWINGS

In order to clearly illustrate technical solutions in embodiments of the present disclosure or related technologies, accompanying drawings required for the description of embodiments or the existing technology are briefly described hereinafter. Obviously, accompanying drawings in following description are only for embodiments of the present disclosure. For those skilled in the art, other drawings may also be obtained according to provided drawings without any creative effort.

The structures, proportions, sizes and the like shown in the drawings in the present disclosure are only configured to cooperate with the contents disclosed in the present disclosure for understanding and reading of those skilled in the art and are not intended to limit the conditions that the application can be implemented, thereby having no technical substantive significance. Any structural modification, proportional relationship change, or size adjustment should still fall within the scope of the technology disclosed in the present disclosure without affecting the produced effect and achieved purpose of the application.

DETAILED DESCRIPTION

Embodiments of the present disclosure are clearly and completely described below with reference to the accompanying drawings in embodiments of the present disclosure. Obviously, described embodiments are only a part of embodiments of the present disclosure, but not all embodiments. According to embodiments in the present disclosure, all other embodiments obtained by those skilled in the art without creative efforts shall fall within the protection scope of the present disclosure.

In order to make above objectives, features and advantages of the present disclosure more clearly understood, the present disclosure is described in further detail below with reference to the accompanying drawings and specific embodiments.

Figure 1:
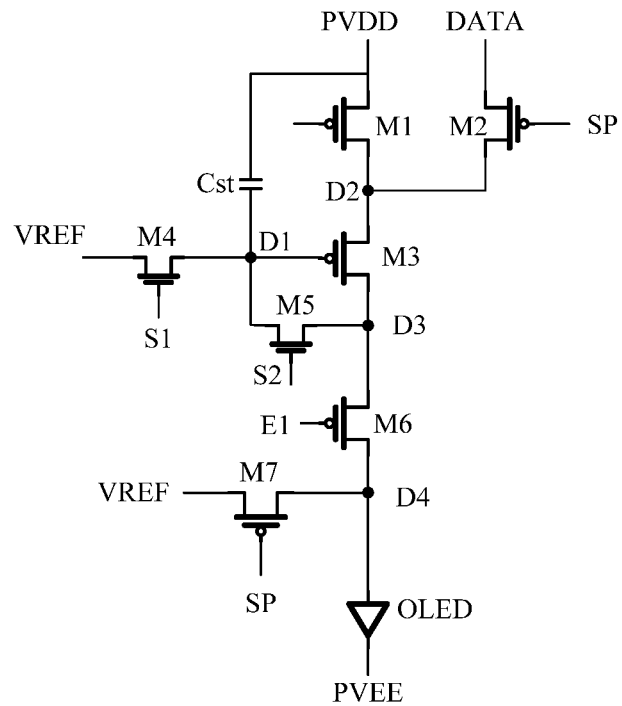
FIG. 1 illustrates a structural schematic of a pixel circuit in a display panel.

FIG. 1 illustrates a structural schematic of a pixel circuit in a display panel. The display panel may be an OLED (organic light-emitting diode) display panel. The sub-pixels in the display panel may be OLEDs; and the sub-pixel may be controlled by a pixel circuit for light-emitting display. The pixel circuit diagram shown in FIG. 1 may be a 7T1C pixel circuit, including 7 transistors and 1 storage capacitor Cst. The seven transistors may be the first transistor M1 to the seventh transistor M7 in sequence.

The gate electrode of the first transistor M1 may be inputted with a light-emitting control signal E1, and the first electrode of the first transistor M1 may be connected to a first power supply voltage PVDD. The gate electrode of the second transistor M2 may be inputted with a control signal SP, and the first electrode of the second transistor M2 may be connected to a data voltage DATA. The second electrode of the second transistor M2, the second electrode of the first transistor M1, and the first electrode of the third transistor M3 may be all connected to a node D2. The gate electrode of the third transistor M3 may be connected to a node D1, and the second electrode of the third transistor M3 may be connected to a node D3. The gate electrode of the fourth transistor M4 may be connected with a first scan signal S1, the first electrode of the fourth transistor M4 may be connected to a reference voltage VREF, and the second electrode of the fourth transistor M4 may be connected to the node D1. The gate electrode of the fifth transistor M5 may be connected to a second scan signal S2, the first electrode of the fifth transistor M5 may be connected to the node D1, and the second electrode of the fifth transistor M5 may be connected to the node D3. The gate electrode of the sixth transistor M6 may be connected to the light-emitting control signal E1; and the first electrode of the sixth transistor M6 may be connected to the node D3. The second electrode of the sixth transistor M5, the second electrode of the seventh transistor M7 and the anode of the OLED may be all connected to the node D4. The gate electrode of the seventh transistor M7 may be connected to the control signal SP, and the first electrode of the seventh transistor M7 may be connected to the reference voltage VREF. The storage capacitor Cst may be connected between the node D1 and the first electrode of the first transistor M1. The cathode of the OLED may be connected to a second power supply voltage PVEE. The first power supply voltage PVDD and the second power supply voltage PVEE may be both DC voltages; and the second power supply voltage PVEE may be less than the first power supply voltage PVDD.

The fourth transistor M4 and the fifth transistor M5 may be IGZO (indium gallium zinc oxide) transistors, which are on when the level is high and off when the level is low. Other transistors may be LTPS (low temperature polysilicon) transistors, which are on when the level is low and off when the level is high.

The third transistor M3 may be a drive transistor; the fourth transistor M4 may be a gate reset transistor of the drive transistor, configured for voltage reset of the node D1; and the fifth transistor M5 may be a compensation transistor, configured for performing voltage compensation on the drive transistor.

It should be noted that, in embodiments of the present disclosure, the pixel circuit may not be limited to the 7T1C circuit shown in FIG. 1, and may also be a 6T1C, 8T1C circuit or any pixel circuit including the drive transistor, the gate reset transistor of the drive transistor, and the compensation transistor.

The pixel circuit may need to provide the scan signals through shift registers.

Figure 2:
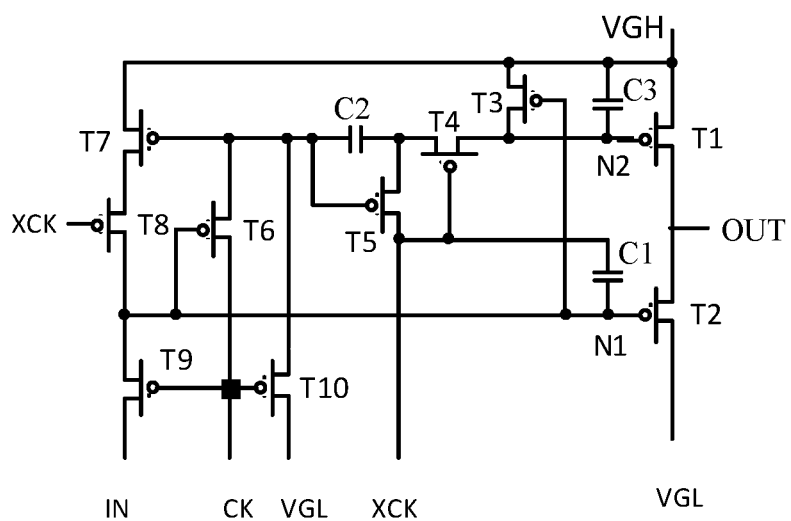
FIG. 2 illustrates a circuit diagram of a shift register.

FIG. 2 illustrates a circuit diagram of a conventional shift register including switch transistors T1 to T10 and capacitors C1 to C3. Each switch transistor may be a PMOS. The second electrode of the switch transistor T1 and the first electrode of the switch transistor T2 may be connected to the output terminal OUT of the shift register. The output signal of the shift register shown in FIG. 2 may have the tailing problem of the output signal as shown in FIG. 3.

Figure 3:
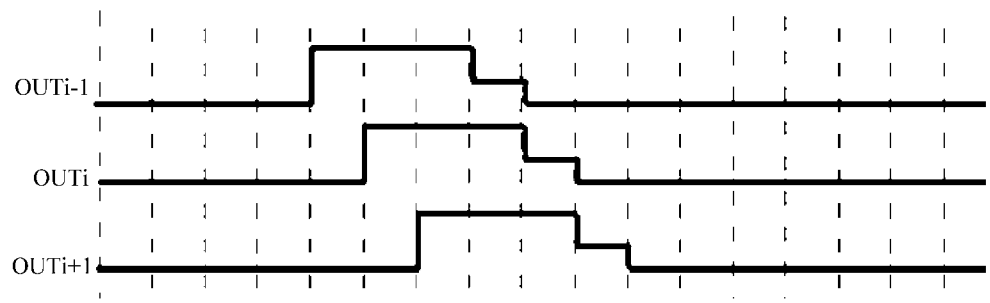
FIG. 3 illustrates a time sequence diagram of output signals of shift registers in FIG. 2.

FIG. 3 illustrates a time sequence diagram of output signals of the shift registers in FIG. 2. FIG. 3 illustrates the time sequence diagram of the output signals of output terminals, including OUTi−1, OUTi and OUTi+1, of continuous three-stage shift registers. For example, OUTi is an i-stage output terminal, OUTi−1 is an (i−1)-stage output terminal, and OUTi+1 is an (i+1)-stage output terminal. According to FIG. 3, the output signal of the shift register cannot directly jump from a high-level signal to a low-level signal in the process of switching from a high-level signal to a low-level signal and may need pass a step process (stage) between the high-level signal and the low-level signal. After reliability verification of the circuit performance, according to different threshold voltages Vth of the switch transistor T2, the tail height may be different in the step process.

The main reason that the high-level signal cannot be directly jumped to the low-level signal may be that the capacitor C1 is directly connected to the node N1. Due to the influence of the capacitor C1, in the process of switching the high-level signal to the low-level signal, the coupling effect between the first electrode and the gate electrode of the switch transistor T2 may be extremely small, and the potential of the node N1 may not be effectively pulled down, which may result in the tailing problem of output signals.

In order to solve above-mentioned problem, in embodiments of the present disclosure, a maintaining module may be integrated in the shift register. The maintaining module may pull down the potential of the first node according to an input signal, a first clock signal, a second clock signal, and a low-level signal. Therefore, when the output signal of the shift register is the low-level signal, the stability of the low-level signal outputted may be maintained; in addition, when jumping from the high-level signal to the low-level signal, the maintaining module may prevent the capacitor from being directly connected to the first node, so that the output signal may quickly jump from the high-level signal to the low-level signal to solve tailing problem of output signals. Thus, the display problem caused by the tailing of the output signals of the shift register may be solved.

Figure 4:
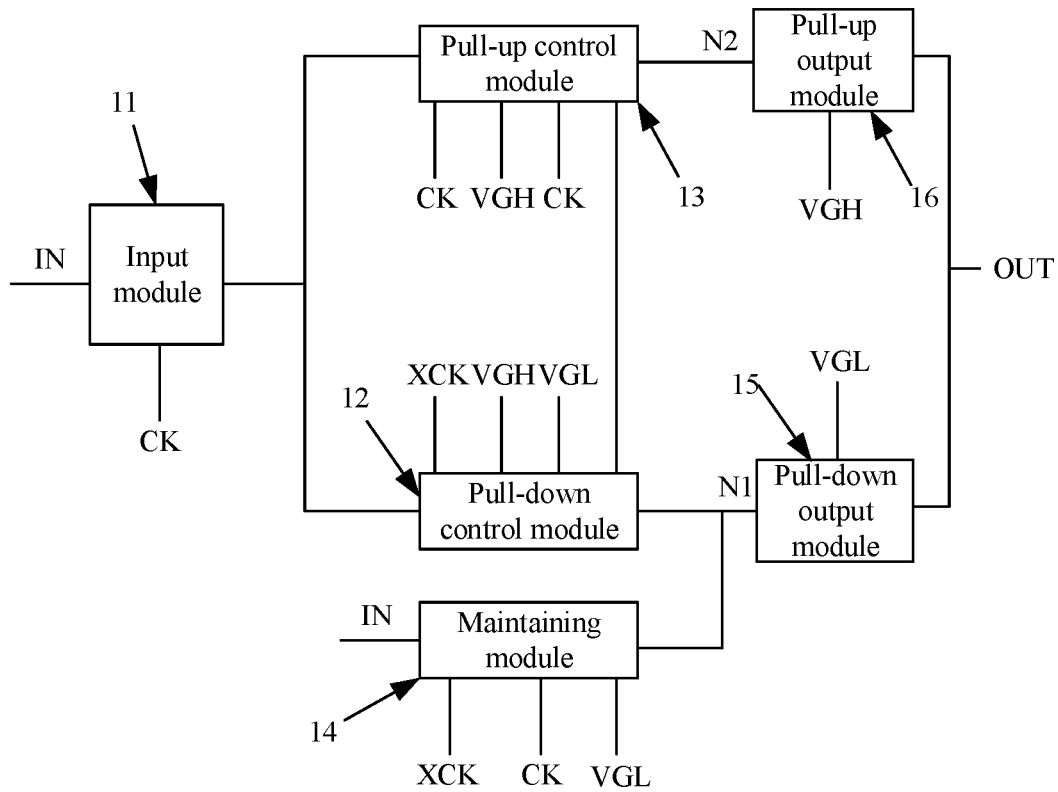
FIG. 4 illustrates a circuit block diagram of a shift register according to various embodiments of the present disclosure.

FIG. 4 illustrates a circuit block diagram of a shift register according to various embodiments of the present disclosure. The shift register may include an input module 11, configured to output a first control signal according to an input signal IN; a pull-down control module 12, configured to control the potential of a first node N1 according to a first clock signal XCK, a high-level signal VGH, a low-level signal VGL, and the first control signal; a pull-up control module 13, configured to control the potential of a second node N2 according to the first clock signal XCK, the second clock signal CK, the high-level signal VGH, and the first control signal; a maintaining module 14, configured to pull down the potential of the first node N1 according to the input signal IN, the first clock signal XCK, the second clock signal CK, and the low-level signal VGL; a pull-down output module 15, configured to control the output terminal OUT of the shift register to output a low-level signal according to the potential N1 of the first node; and a pull-up output module 16, configured to control the output terminal OUT of the shift register to output a high-level signal according to the potential of the second node N2.

The maintaining module 14 may be integrated in the shift register shown in FIG. 4. The maintaining module 14 may pull down the potential of the first node N1 according to the input signal IN, the first clock signal XCK, the second clock signal CK, and the low-level signal VGL. The maintaining module 14 may pull down the potential of the first node N1 according to the input signal IN, the first clock signal XCK, the second clock signal CK, and the low-level signal VGL. Therefore, when the output signal of the shift register is the low-level signal VGL, the stability of the low-level signal VGL outputted may be maintained; in addition, when jumping from the high-level signal VGH to the low-level signal VGL, the maintaining module 14 may prevent the capacitor from being directly connected to the first node N1, so that the output signal may quickly jump from the high-level signal VGH to the low-level signal VGL to solve tailing problem of output signals. Thus, the display problem caused by the tailing of the output signals of the shift register may be solved.

As shown in FIG. 4, the pull-down control module 12 may be connected between the output terminal of the input module 11 and the first node N1; the pull-up control module 13 may be connected between the output terminal of the input module 11 and the second node N2; the pull-up control module 13 may be connected to the pull-down control module 12; and the maintaining module 14 may be connected to the first node N1.

In embodiments of the present disclosure, the maintaining module 14 may be configured to control the potential of a third node according to the input signal IN, the first clock signal XCK, the second clock signal CK and the low-level signal VGL. When the output signal jumps from the high-level signal VGH to the low-level signal VGL, the potential of the first node N1 may be pulled down through the coupling between the output terminal OUT of the shift register and the first node N1, such that the output terminal OUT of the shift register may output the low-level signal VGL. After the output terminal OUT of the shift register outputs the low-level signal VGL, the potential of the third node may be coupled with the first capacitor, and the potential of the third node may be pulled down. By pulling down the potential of the first node N1 through the potential of the third node N3, the output terminal OUT of the shift register may be maintained to output the low-level signal.

Figure 5:
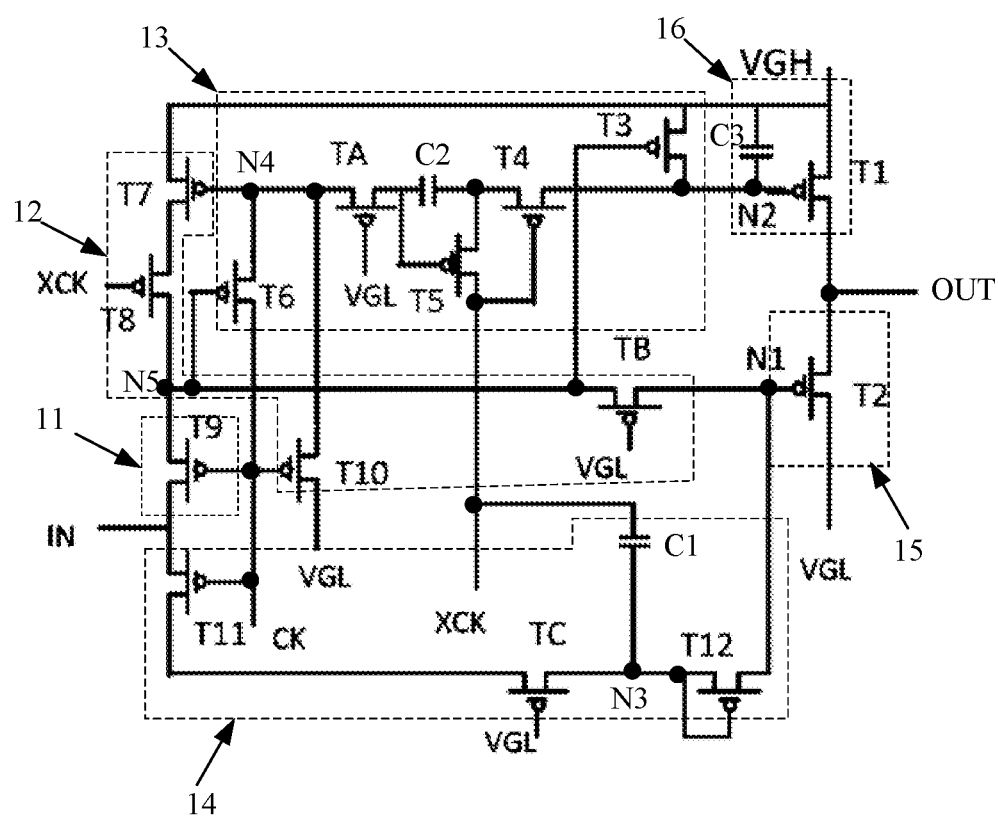
FIG. 5 illustrates a circuit diagram of a shift register according to various embodiments of the present disclosure.

A switch element may be connected between the first capacitor and the first node N1, so that the output signal may quickly jump from the high-level signal VGH to the low-level signal VGL, thereby solving the tailing problem of the output signal. The switch element connected between the first capacitor and the first node N1 may be a diode-connected transistor (i.e., the first switch transistor T12) as shown in FIG. 5 (that is, the gate electrode of the transistor may be connected to the first electrode of the transistor). In such way, relative to the circuit structure shown in FIG. 2, the first node N1 may no longer be directly coupled to the first capacitor C1. The first capacitor C1 may be connected to the first clock signal XCK through the switch element which may play a coupling role. As a result, the output signal of the shift register may quickly jump from the high-level signal VGH to the low-level signal VGL, thereby realizing the output signal without tailing.

The maintaining module 14 may include the first capacitor C1 and the first switch transistor T12. The first capacitor C1 may be connected to the third node N3; and the first switch transistor T12 may be connected between the first node N1 and the third node N3. In such way, through separating the first capacitor C1 and the first node N1 by the first switch transistor T12, when the output signal of the shift register is switched from the high-level signal VGH to the low-level signal VGL, the influence of the first capacitor C1 on the potential of the first node N1 may be reduced. Therefore, according to the coupling between the output terminal OUT of the shift register and the first node N1, the output signal of the shift register may quickly jump from the high-level signal VGH to the low-level signal VGL, thereby solving the tailing problem of the output signal.

FIG. 5 illustrates a circuit diagram of a shift register according to various embodiments of the present disclosure. Referring to FIG. 5, the maintaining module 14 may include the first switch transistor T12, where the gate electrode and the first electrode of the first switch transistor T12 may be both connected to the third node N3, and the second electrode of the first switch transistor T12 may be connected to the first node N1; the second switch transistor T11, where the gate electrode of the second switch transistor T11 may be configured for an input of the second clock signal CK, and the first electrode of the second switch transistor T11 may be configured for an input of the input signal IN; and the third switch transistor TC, where the gate electrode of the third switch transistor TC may be configured for an input of the low-level signal VGL, the first electrode of the third switch transistor may be connected to the second electrode of the second switch transistor T11, and the second electrode of the third switch transistor TC may be connected to the third node N3. One electrode plate of the first capacitor C1 may be configured for an input of the first clock signal XCK, and the other electrode plate may be connected to the third node N3.

According to the maintaining module 14 shown in FIG. 5, when the output signal of the shift register jumps from the high-level signal VGH to the low-level signal VGL, the potential of the first node N1 may be pulled down through the coupling between the output terminal OUT of the shift register and the first node N1, such that the output terminal OUT of the shift register may output the low-level signal VGL. Moreover, at this point, since the first switch transistor T12 is configured to separate the first capacitor C1 and the first node N1, the influence of the first capacitor C1 on the potential of the first node N1 may be effectively reduced. Therefore, according to the coupling between the output terminal OUT of the shift register and the first node N1, the output signal of the shift register may quickly jump from the high-level signal VGH to the low-level signal VGL, thereby solving the tailing problem of the output signal. In addition, after the output terminal OUT of the shift register outputs the low-level signal VGL, through the coupling between the first capacitor C1 and the potential of the third node N3, the potential of the third node N3 may be pulled down. By pulling down the potential of the first node N1 through the potential of the third node N3, the output terminal OUT of the shift register may be maintained to output the low-level signal.

The gate electrode of the first switch transistor T12 may be connected to its own first electrode to be used as a diode. When the output signal jumps from the high-level signal VGH to the low-level signal VGL, the low-level of the first node N1 may be maintained to be stable according to the first switch transistor T12. In other manners, a diode may also be used to replace the first switch T12.

As shown in FIG. 5, the pull-down control module 12 may include the fourth switch transistor T7, where the gate electrode of the fourth switch transistor T7 may be connected to a fourth node N4, and the first electrode of the fourth switch transistor T7 may be configured for an input of the high-level signal VGH; the fifth switch transistor T8, where the gate electrode of the fifth switch transistor T8 may be configured for an input of the first clock signal XCK, the first electrode of the fifth switch transistor T8 may be connected to the second electrode of the fourth switch transistor T7, the second electrode of the fifth switch transistor T8 may be connected to the fifth node N5, and the input module 11 may output the first control signal through the fifth node N5; the sixth switch transistor T10, where the gate electrode of the sixth switch transistor T10 may be configured for an input of the second clock signal CK, the first electrode of the sixth switch transistor T10 may be connected to the fourth node N4, and the second electrode of the sixth switch transistor T10 may be configured for an input of the low-level signal VGL; and the seventh switch transistor TB, where the gate electrode of the seventh switch transistor TB may be configured for an input of the low-level signal VGL, the first electrode of the seventh switch transistor TB may be connected to the fifth node N5, and the second electrode of the seventh switch transistor TB may be connected to the first node N1.

The pull-down control module 12 may realize the pull-down control of the output signal through a circuit structure formed according to the connection of the fourth switch transistor T7 to the seventh switch transistor TB, such that the pull-down output module 15 may be controlled to output the low-level signal VGL according to time sequence.

As shown in FIG. 5, the pull-up control module 13 may include the eighth switch transistor T6, where the first electrode of the eighth switch transistor T6 may be connected to the fourth node N4, the second electrode of the eighth switch transistor T6 may be configured for an input of the second clock signal CK, and the gate electrode of the eighth switch transistor T6 may be connected to the fifth node N5; the ninth switch transistor TA, where the gate electrode of the ninth switch transistor TA may be configured for an input of the low-level signal VGL, and the first electrode of the ninth switch transistor TA may be connected to the fourth node N4; the tenth switch transistor T4, where the gate electrode of the tenth switch transistor T4 may be configured for an input of the first clock signal XCK, the first electrode of the tenth switch transistor T4 may be connected to the second electrode of the ninth switch transistor TA through the second capacitor C2, and the second electrode of the tenth switch transistor T4 may be connected to the second node N2; the eleventh switch transistor T5, where the gate electrode of the eleventh switch transistor T5 may be connected to the second electrode of the ninth switch transistor TA, the gate electrode of the eleventh switch transistor T5 may be connected to its own first electrode through the second capacitor C2, the first electrode of the eleventh switch transistor T5 may be connected to the first electrode of the tenth switch transistor T4, and the second electrode of the eleventh switch transistor T5 is configured for an input of the first clock signal XCK; and the twelfth switch T3, where the gate electrode of the twelfth switch T3 may be connected to a fifth node N5, the first electrode of the twelfth switch T3 may be configured for an input of the high-level signal VGH, the second electrode of the twelfth switch T3 may be connected to the second node N2.

The pull-up control module 13 can realize the pull-up control of the output signal through the circuit structure formed according to the connection of the eighth switch transistor T6 to the twelfth switch transistor T3, such that the pull-up output module 16 may be controlled to output the high-level signal VGH according to time sequence.

As shown in FIG. 5, the pull-down output module 15 may include the thirteenth switch transistor T2, where the gate electrode of the thirteenth switch transistor T2 may be connected to the first node N1, and the first electrode of the thirteenth switch transistor T2 may be connected to the output terminal OUT of the shift register, and the second electrode of the thirteenth switch transistor T2 may be configured for an input of the low-level signal VGL. The pull-down output module 15 may output the low-level signal VGL according to time sequence under the control of the pull-down control module 12 through a switch transistor, and the circuit structure and the control time sequence may be simple.

As shown in FIG. 5, the pull-up module 16 may include the fourteenth switch transistor T1, where the gate electrode of the fourteenth switch transistor T1 may be connected to the second node N2, the first electrode of the fourteenth switch transistor T1 may be configured for an input of the high-level signal VGH, and the second electrode of the fourteenth switch transistor T1 may be connected to the output terminal OUT of the shift register; and include the third capacitor C3 connected between the gate electrode and the first electrode of the fourteenth switch transistor T1.

The pull-up module 16 may output the high-level signal VGH according to time sequence through the fourteenth switch T1 and the third capacitor C3 under the control of the pull-up control module 13, and the circuit structure and the control time sequence may be simple.

As shown in FIG. 5, the input module 11 may include the fifteenth switch transistor T9, where the gate electrode of the fifteenth switch transistor T9 may be configured for an input of the second clock signal CK, the first electrode of the fifteenth switch transistor T9 may be connected to the fifth node N5, the first electrode of the fifteenth switch transistor T9 may be configured to output the first control signal, and the second electrode of the fifteenth switch transistor T9 may be connected to the maintaining module 14 and configured to be connected with the input signal IN. The input module 11 may control the output of the first control signal in time sequence according to the second clock signal CK through the fifteenth switch transistor T9, and the circuit structure and the control time sequence may be simple.

In embodiments of the present disclosure, each of the input module 11, the pull-down control module 12, the pull-up control module 13, the maintaining module 14, the pull-down output module 15, and the pull-up output module 16 may include at least one switch transistor, and each switch transistor may be a PMOS. As shown in FIG. 5, the first switch transistor T12 to the fifteenth switch transistor T9 may be all PMOS.

In each circuit module, the circuit structure may be not limited to the structure shown in FIG. 5. For example, the pull-down output module 15 may also be provided with other transistors connected in parallel or in series with the thirteenth switch transistor T2.

Compared with the method shown in FIG. 2, in the technical solution of embodiments of the present disclosure, the first capacitor C1 that is directly connected and coupled at the first node N1 may not be designed. There is no influence of the capacitance directly connected to the first node N1. Therefore, when the pull-down output module 15 changes from the high-level signal VGH to the low-level signal VGL, the output terminal OUT may be coupled to pull down the first node N1, which may make the output signal quickly jump to the low-level signal VGL. In the manner shown in FIG. 2, due to the influence of the first node N1 being directly connected to the first capacitor C1, the output terminal OUT of the shift register and the first node N1 may not be able to maintain the potential of the first node N1 extremely low. However, in the technical solution of the present disclosure, through separating the first capacitor C1 and the first node N1 by the first switch transistor T12, in the process that the pull-down output module 15 changes from the high-level signal VGH to the low-level signal VGL, the role of the output terminal OUT and the first node N1 may be fully used to pull the potential of the first node N1 to be extremely low.

Figure 6:
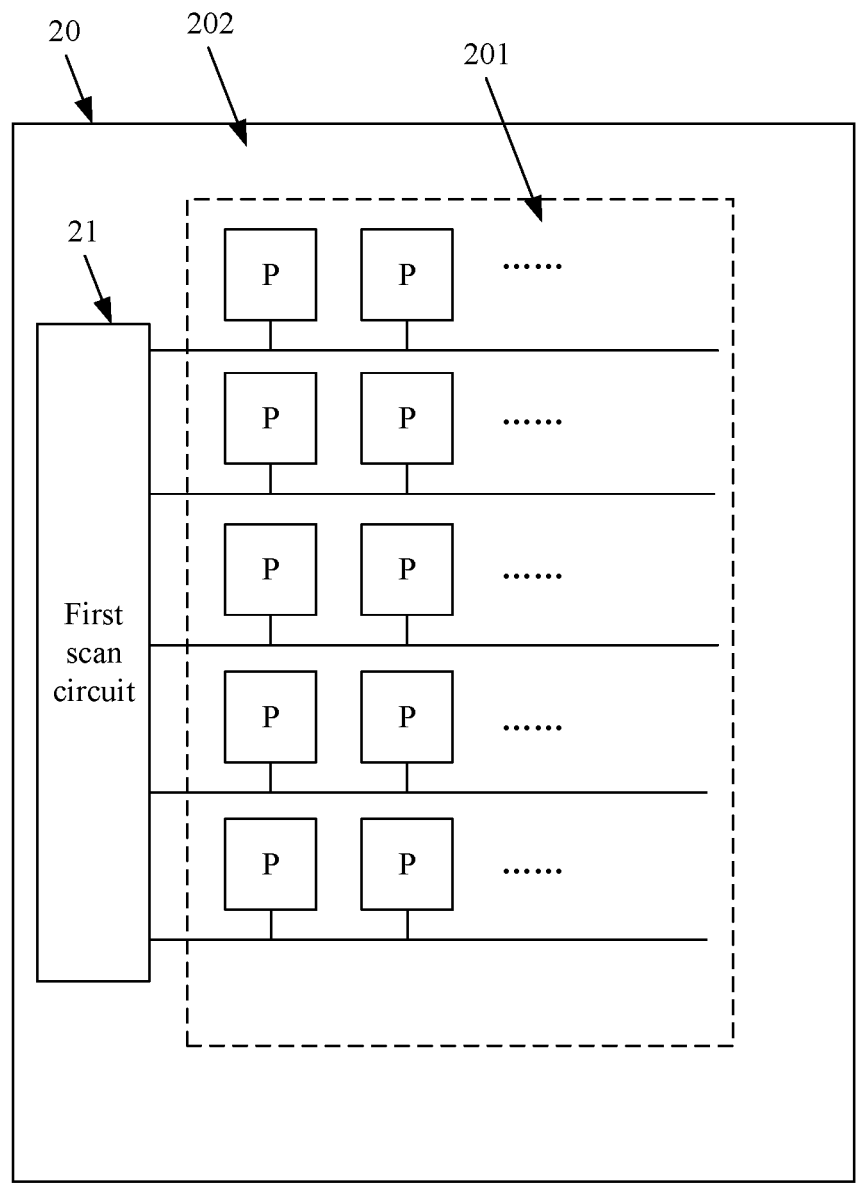
FIG. 6 illustrates a structural schematic of a display panel according to various embodiments of the present disclosure.

According to above-mentioned embodiments, another embodiment of the present disclosure further provides a display panel shown in FIG. 6.

FIG. 6 illustrates a structural schematic of a display panel according to various embodiments of the present disclosure. The display panel 20 shown in FIG. 6 may include a display array, including sub-pixels for picture display; pixel circuits P connected to the sub-pixels, for generating a drive current according to the scan signal to control the sub-pixels to perform light-emitting display; and the first scan circuit 21, where the first scan circuit 21 may include above-mentioned shift registers, and the shift registers may be connected to the pixel circuits P and configured to provide the pixel circuits P with scan signals.

The sub-pixel may not be shown in FIG. 6, the sub-pixel may be an OLED device, and the circuit connection structure of the pixel circuit P and the sub-pixel may be referred to FIG. 1, which may not be described in detail according to various embodiments of the present disclosure.

The display panel 20 may include a display region 201 and a frame region 202; and the frame region 202 may surround at least a part of the display region 201. The sub-pixels and the pixel circuits P may be in the display region 201, and the first scan circuit 21 may be in the frame region 202.

Figure 7:
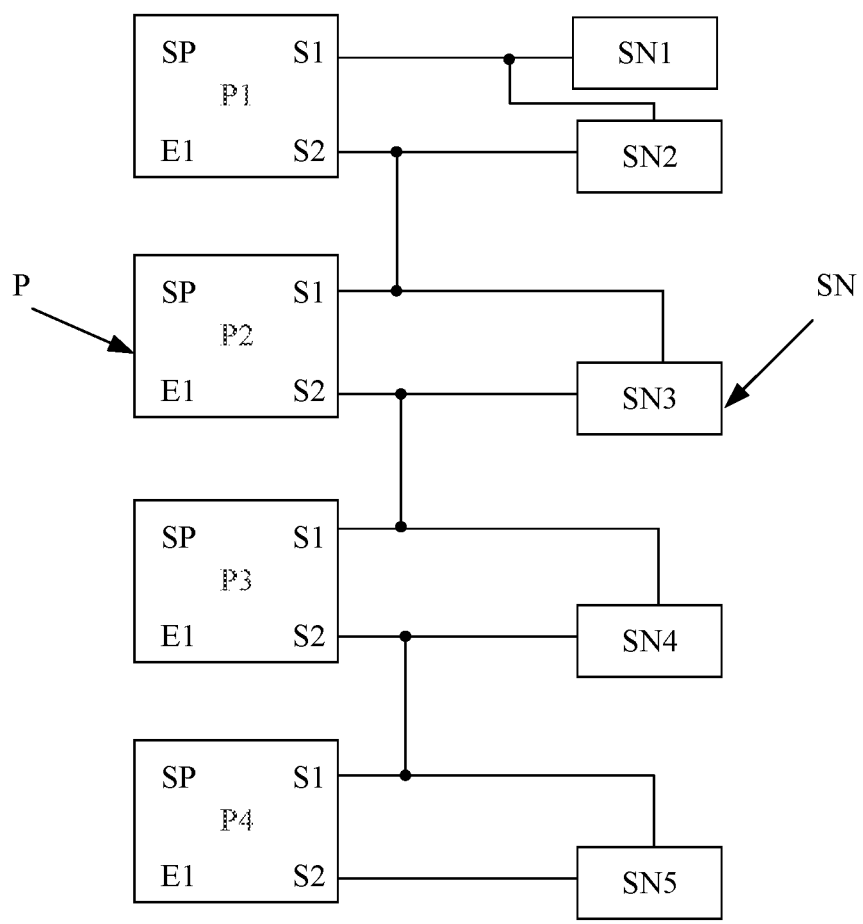
FIG. 7 illustrates a schematic of a connection relationship between shift registers and pixel circuits in a first scan circuit according to various embodiments of the present disclosure.

FIG. 7 illustrates a schematic of a connection relationship between shift registers and pixel circuits in the first scan circuit according to various embodiments of the present disclosure. The first scan circuit may include a plurality of cascaded shift registers SN. The sub-pixels may be connected to the pixel circuits P in a one-to-one correspondence; the sub-pixels may be arranged in an array; and the pixel circuits P connected to the sub-pixels may have a corresponding array relationship. In the manner shown in FIG. 7, only the pixel circuits P corresponding to the first four rows of sub-pixels in a same column may be shown, which may be pixel circuits P1-P4 sequentially; correspondingly, the shift registers SN of the first five stages may be shown, which may be shift registers SN1-SN5 sequentially.

In embodiments of the present disclosure, it is assumed that there are m rows of sub-pixels, and m is a positive integer greater than 1. The first scan circuit may include m-stage shift registers SN which may be the first-stage shift register SN1 to the Nth shift register SNm, sequentially.

The output terminal of the first-stage shift register SN1 may be connected to the pixel circuit P1 connected to the first row of sub-pixels and configured to provide the first scan signal S1 for the pixel circuit P1 connected to the first row of sub-pixels.

The output terminal of the ith shift register SNi may be connected to the pixel circuit Pi connected to the ith row of sub-pixels and configured to provide the second scan signal S2 for the pixel circuit Pi connected to the ith row of sub-pixels, where i is a positive integer greater than 1 and not greater than N.

In addition, the second scan signal S2 of the pixel circuit P connected to the sub-pixels of a previous row may be configured as the first scan signal S1 of the pixel circuit P connected to the sub-pixels of a next row. The output signal of the shift register SN of a previous stage may be configured as the input signal of the shift register SN of a next stage.

Figure 8:
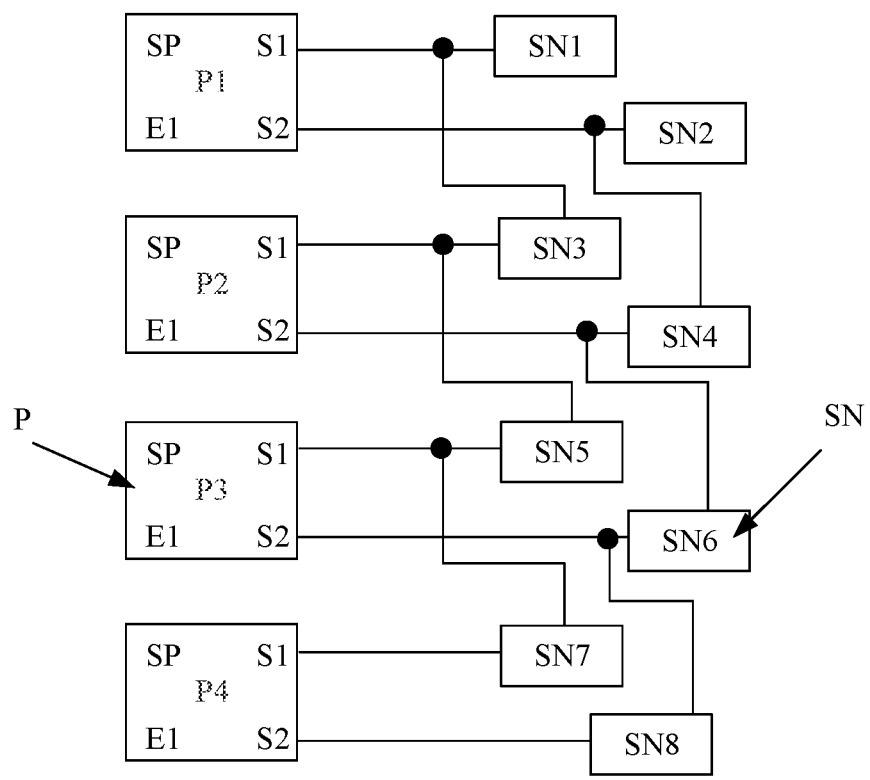
FIG. 8 illustrates another schematic of a connection relationship between shift registers and pixel circuits in a first scan circuit according to various embodiments of the present disclosure.

FIG. 8 illustrates another schematic of a connection relationship between shift registers and pixel circuits in the first scan circuit according to various embodiments of the present disclosure. The first scan circuit may include a plurality of cascaded shift registers SN; the sub-pixels may be connected to the pixel circuits P in a one-to-one correspondence; the sub-pixels may be arranged in an array; and the pixel circuits P connected to the sub-pixels may have a corresponding array relationship.

In the manner shown in FIG. 8, the pixel circuit P connected to each row of sub-pixels may be respectively connected to two stages of shift registers; and the first scan signal S1 and the second scan signal S2 may be respectively inputted through two stages of shift registers. When there are m rows of sub-pixels, there are 2m stages of shift registers correspondingly.

The (2j−1)th-stage shift register SN2j−1 may be connected to the pixel circuit P connected to the jth row of sub-pixels and configured to provide the first scan signal S1 for the pixel circuit P connected to the jth row of sub-pixels, where j is a positive integer not greater than m.

The (2j)th-stage shift register SN2j may be connected to the pixel circuit P connected to the jth row of sub-pixels and configured to provide the second scan signal S2 for the pixel circuit P connected to the jth row sub-pixels.

The output signal of the (2j−1)th-stage shift register SN2j−1 may be configured as the input signal of the (2j+1)th-stage shift register SN2j+1. The output signal of the (2j)th-stage shift register SN2j may be configured as the input signal of the (2j+2)th-stage shift register SN2j+2.

According to embodiments of the present disclosure, the display panel may further include the second scan circuit for providing the control signal SP for the pixel circuit. The second scan circuit may include a plurality of cascaded scan units.

Figure 9:
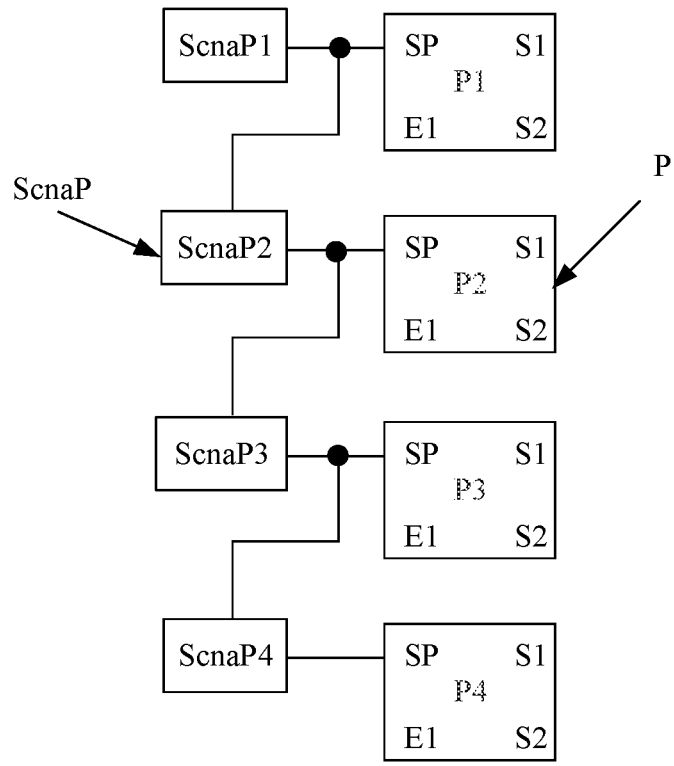
FIG. 9 illustrates a schematic of a connection relationship between shift registers and pixel circuits in a second scan circuit according to various embodiments of the present disclosure.

FIG. 9 illustrates a schematic of a connection relationship between shift registers and pixel circuits in the second scan circuit according to various embodiments of the present disclosure. In the second scan circuit, there are a plurality of cascaded scan units ScnaP; and the scan units may be connected to the sub-pixel rows in a one-to-one correspondence.

When there are m rows of sub-pixels, there are correspondingly m stages of scan units; and the m stages of scan units may be sequentially the 1st-stage scan unit 1 to the mth-stage scan unit m. The jth scan unit ScnaPj may be connected to the pixel circuit P connected to the jth row of sub-pixels and configured to provide the control signal SP for the pixel circuit P connected to the jth row sub-pixels. The output signal of the scan unit ScnaP of a previous stage may be configured as the input signal of the scan unit ScnaP of a next stage.

The first scan circuit 21 of the display panel described in embodiments of the present disclosure may use the shift register in above-mentioned embodiments to solve the tailing problem when the output signal of the shift register jumps from the high-level signal VGH to the low-level signal VGL, thereby resolving the display problem caused by tailing and improving display quality.

According to above-mentioned embodiments, another embodiment of the present disclosure further provides a display drive method for a display panel. The display panel may include sub-pixels and pixel circuits connected to the sub-pixels; and the display drive method is shown in FIG. 10.

Figure 10:
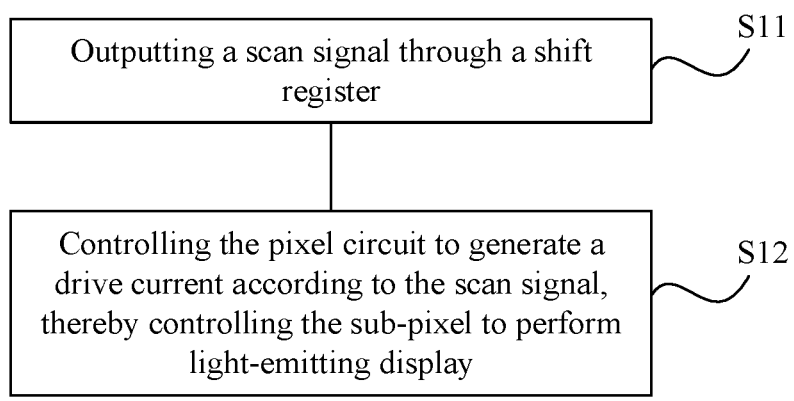
FIG. 10 illustrates a flowchart of a display drive method for a display panel according to various embodiments of the present disclosure.

FIG. 10 illustrates a flowchart of the display drive method for the display panel according to various embodiments of the present disclosure. The display drive method may include following exemplary steps.

At S11, the scan signal may be outputted through the shift register.

The shift register may include the input module, configured to output the first control signal according to the input signal; the pull-down control module, configured to control the potential of the first node according to the first clock signal, the high-level signal, the low-level signal, and the first control signal; the pull-up control module, configured to control the potential of the second node according to the first clock signal, the second clock signal, the high-level signal, and the first control signal; the maintaining module, configured to pull down the potential of the first node according to the input signal, the first clock signal, the second clock signal, and the low-level signal; the pull-down output module, configured to control the output terminal of the shift register to output the low-level signal according to the potential of the first node; and the pull-up output module, configured to control the output terminal of the shift register to output the high-level signal according to the potential of the second node.

The circuit structure of the shift register may refer to the description of above-mentioned embodiments and may not be repeated in embodiments of the display drive method.

At S12, according to the scan signal, the pixel circuit may be controlled to generate a drive current to control the sub-pixel to perform light-emitting display.

In embodiments of the present disclosure, according to the shift registers in above-mentioned embodiments, the display drive method may provide scan signals for the sub-pixels, which may solve the display problem caused by tailing of the output signal of the shift register and improve the display quality.

Optionally, the method for outputting the scan signal by the shift register may include that when the output signal jumps from the high-level signal to the low-level signal, the potential of the first node may be pulled down through the coupling between the output terminal of the shift register and the first node, such that the output terminal of the shift register may output the low-level signal; after the output terminal of the shift register outputs the low-level signal, the potential of the third point may be coupled with the first capacitor, the potential of the third node may be pulled down, and by pulling down the potential of the first node through the potential of the third node, the output terminal of the shift register may be maintained to output the low-level signal.

In embodiments of the present disclosure, the switch element may be connected between the first node and the first capacitor. In such way, when the output signal jumps from the high-level signal to the low-level signal, the influence of the first capacitor on the potential of the first node may be avoided, and the coupling effect between the output terminal of the shift register and the first node may be ensured. Therefore, the low potential of the first node may be obtained, so that the output terminal may quickly jump to the low-level signal. In addition, after the output terminal of the shift register outputs the low-level signal, the potential of the third point may also be coupled with the first capacitor, and the potential of the third node may be pulled down. Furthermore, the potential of the first node may be further pulled down, and the output terminal of the shift register may be maintained to output the low-level signal, thereby ensuring stability of outputting the low-level signal.

A time sequence period of the input signal may include the 1st time-segment to the 9th time-segment according to the time sequence. The 2nd time-segment to the 4th time-segment may form the turn-on time-segment of the input signal, and the other time-segments may form the turn-off time-segment of the input signal. The period of the first clock signal may be same as the period of the second clock signal. The first clock signal may be turned on in the (2i−1)th time-segment of the input signal, and turned off in the (2i)th time-segment of the input signal. The second clock signal may be turned on in the (2i)th time-segment of the input signal and turned off in the (2i−1)th time-segment of the input signal.

In the 6th time-segment, the input signal may be turned off, the first clock signal may be turned off, the second clock signal may be turned on, the output signal of the output terminal of the shift register may start to decrease from the high-level signal, and the potential of the first node may be pulled down by coupling the first node, such that the output terminal of the shift register may output the low-level signal. The off potential of the input signal may be written into the third node through the first switch transistor and the second switch transistor, so that the third switch transistor may be turned off. According to above-mentioned circuit structure of the maintaining module, the fast jumping of the output signal of the shift register may be realized in the 6th time-segment.

The working process of the shift register in embodiments of the present disclosure is further described below with reference to specific time sequence diagram.

Figure 11:
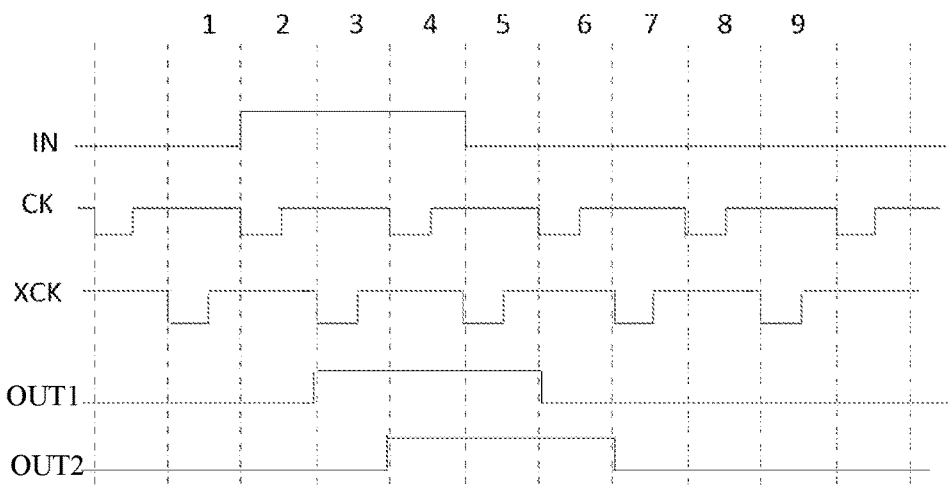
FIG. 11 illustrates a time sequence diagram of signals of a shift register according to various embodiments of the present disclosure.

FIG. 11 illustrates a time sequence diagram of signals of the shift register according to various embodiments of the present disclosure. Referring to FIGS. 5 and 11, the first node N1 is not directly connected to the first capacitor C1, so that the thirteenth switch transistor T2 may pull down the potential of the first node N1 through the coupling effect of its own first electrode and gate electrode; and the maintaining module 14 may be added to maintain the stability of the output signal at the low-level signal VGL through the maintaining module 14. When the low-level signal VGL is outputted, the first capacitor C1 may further lower the potential of the first node N1 through the first switch transistor T12 to maintain the first node N1 at the low potential continuously, thereby maintaining the stability of the output signal at the low-level signal VGL.

For example, within one time sequence period of the input signal IN, in the 1st time-segment, the first clock signal XCK may be at the low level, the first capacitor C1 may pull down the third node N3, and the first switch transistor T12 may be in conduction, such that the first node N1 may be at the low level, the thirteenth switch transistor T2 may be in conduction, and the low-level signal VGL may be outputted.

In the 2nd time-segment, the second clock signal CK may be at the low level, the input signal IN may be at the high level, the first switch T12 may be turned off, and the low-level signal VGL may be written into the fourth node N4 according to the conducting sixth switch T10, such that the fourth node N4 may be at the low level. In such time-segment, since the fourteenth switch T1 is also turned off, the output signal may maintain the low-level signal VGL of previous time-segment.

In the 3rd time-segment, the first clock signal XCK may be at the low level, the potential of the second node N2 may be pulled down, the fourteenth switch transistor T1 may be in conduction, and the output terminal OUT may output the high-level signal VGL. Meanwhile, the fifth switch transistor T8 may be turned on, and the high-level signal VGH may be written into the first node N1 through the fourth switch transistor T7 and the fifth switch transistor T8, such that the first node N1 may be at the high level, and the thirteenth switch transistor T2 may be maintained to be off.

In the 4th time-segment, the first clock signal XCK may be at the high level, the tenth switch T4 may be turned off, the second clock signal CK may be at the low level, the fifteenth switch T9 may be in conduction, the high-level input signal IN may be written into the first node N1 through the conducting seventh switch TB, and the thirteenth switch T2 may be maintained to be off. During such time-segment, the high-level signal VGH may be maintained to be outputted.

In the 5th time-segment, the first clock signal XCK may be at the low level, the input signal IN may be at the low level, the second clock signal CK may be at the high level, the low-level may not be written into the first node N1, and the thirteenth switch T2 may be maintained to be off.

In the 6th time-segment, the input signal IN may be at the low level, the second clock signal CK may be at the low level, and the low-level input signal IN may pass through the conducting fifteenth switch transistor T9, the seventh switch transistor TB may be written into the first node N1, and the output terminal OUT may start to turn low from the high-level signal VGH to the low-level signal VGL. The potential of the output signal becomes lower, and the output terminal OUT may be coupled to the first node N1. In such way, the potential of the first node N1 may be lower, the potential of the first node N1 may be extremely lower than the low-level signal VGL, the thirteenth switch transistor T2 may be completely turned on, and the output terminal OUT may output the low-level signal VGL, thereby realizing no tailing output. Meanwhile, the low-potential input signal IN may write the low-potential into the third node N3 through the conducting second switch transistor T11 and the third switch transistor TC. The gate electrode of the first switch transistor T12 is connected to the first electrode, and the potential of the first node N1 is much lower than the low-level signal VGL, so that the first switch transistor T12 may be turned off at this point.

In the 7th and 9th time-segments, the first clock signal XCK may change from the high level to the low level, and the third node N3 may be pulled down, through the coupling of the first capacitor C1, from the low-level signal VGL to extremely lower than the low-level signal VGL. Therefore, the first switch transistor T12 may be in conduction, an extremely low potential may be written into the first node N1, the thirteenth switch transistor T2 may be maintained, and the low potential output may be maintained to be stable.

In the 8th time-segment, the second clock signal CK may be at the low level first, and the low level may be written into the left side of the seventh switch transistor TB and the third switch transistor TC. Writing the low level into the first electrode on the left side of the third switch transistor TC may prevent the coupling to cause the potential of the third node N3 to jump from the high level to the low level when the first clock signal XCK switches between high and low levels and preventing the leakage potential of the third node N3 from becoming high after a long time. When the second clock signal CK becomes the high level, since the gate electrode of the eighth switch transistor T6 is connected to the low level of the first electrode on the left side of the seventh switch transistor TB, such that the fourth node N4 may write the second clock signal CK at the high level to turn off the fourth switch transistor T7.

In embodiments of the present disclosure, the high level of each signal may be equal to VGH, and the low level may be equal to VGL. In above description, the output signal OUT1 of the first-stage shift register is taken as an example for description, and the output principle of the other-stage shift registers may be same and not repeated in various embodiments of the present disclosure.

Figure 12:
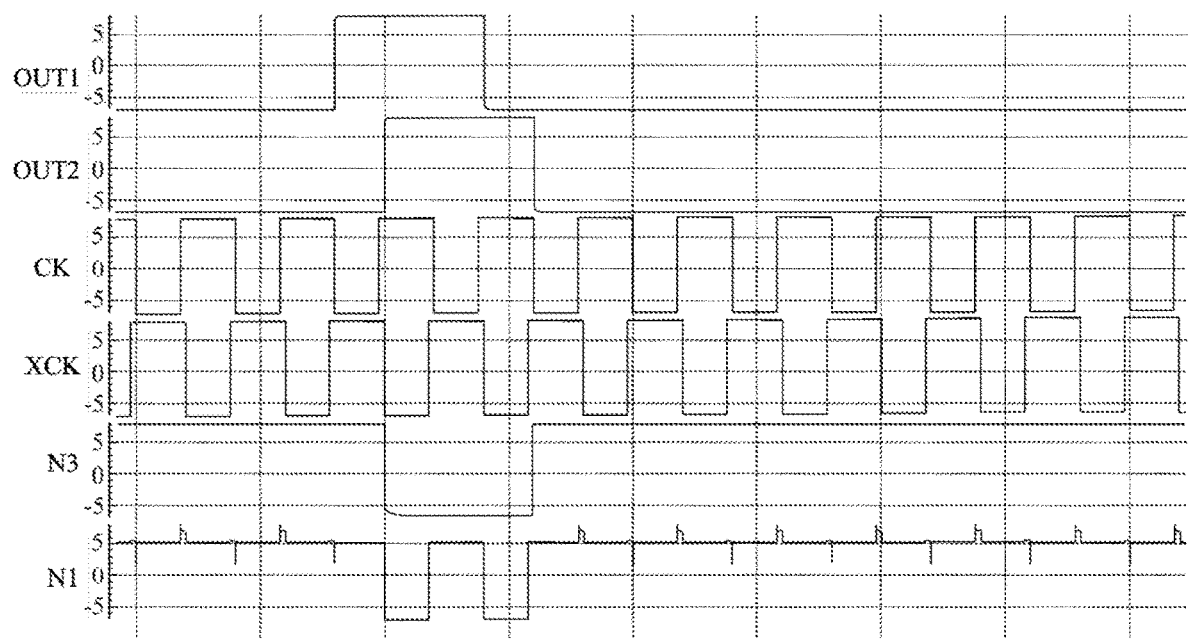
FIG. 12 illustrates a time sequence diagram of simulation signals of a shift register according to various embodiments of the present disclosure.

FIG. 12 illustrates a time sequence diagram of simulation signals of the shift register according to various embodiments of the present disclosure. According to the simulation, it can be seen that the output signal of the shift register may have no tailing problem during the high-low-level switching process.

From above-mentioned embodiments, it may be seen that the shift register, the display panel, and the display drive method provided by the present disclosure may achieve at least following beneficial effects.

In the shift register, the display panel, and the display drive method provided in various embodiments of the present disclosure, the maintaining module may be integrated in the shift register. The maintaining module may pull down the potential of the first node according to the input signal, the first clock signal, the second clock signal, and the low-level signal. Therefore, when the output signal of the shift register is the low-level signal, the stability of the low-level signal outputted may be maintained; in addition, when jumping from the high-level signal to the low-level signal, the maintaining module may prevent the capacitor from being directly connected to the first node, so that the output signal may quickly jump from the high-level signal to the low-level signal to solve tailing problem of output signals. Thus, the display problem caused by the tailing problem of the output signals of the shift register may be solved.

Various embodiments in the present disclosure may be described in a progressive manner, a parallel manner, or a combination of progressive and parallel manners. Each embodiment may focus on the differences from other embodiments; and same and similar parts between various embodiments may be referred to each other. Since the display panel and the display drive method disclosed in embodiments correspond to the display drive circuit disclosed in embodiments, the description may be relatively simple, and relevant part may be referred to the description of the display drive circuit.

It should be noted that, in the description of the present disclosure, the description of the drawings and embodiments are illustrative rather than restrictive. Same drawing numbers may identify same structures throughout embodiments of the present disclosure. Additionally, the thicknesses of certain layers, films, panels, regions and the like may be exaggerated in the drawings for understanding and ease of description. It should also be understood that when an element such as a layer, film, region or substrate is referred to as being "on" another element, the element may be directly on the other elements, or intermediate elements may be present. In addition, "on" may refer to positioning an element on or below another element but may not essentially refer to positioning the element on an upper side of another element according to the direction of gravity.

The orientation or positional relationship indicated by the terms "upper", "lower", "top", "bottom", "inner", "outer" and the like may be based on the orientation or positional relationship shown the drawings. The orientation or positional relationship may only for the convenience of describing the present disclosure and simplifying the description, rather than indicate or imply that the device or element referred to must have a particular orientation and be constructed and operated in a particular orientation; and therefore, the orientation or positional relationship should not be understood as the limitation of the present disclosure. When a component is considered to be "connected" to another component, it may be directly connected to the other component or there may be an intermediate component between the component and the other component.

It should also be noted that in the present disclosure, relational terms such as first and second may be used only to distinguish one entity or operation from another and may not necessarily require or imply that such actual relationship or order is between those entities or operations.

Moreover, the terms "comprise", "contain" or any other variation thereof are intended to encompass a non-exclusive inclusion, such that an article or equipment comprising a list of elements may not only include those elements, but also other elements not expressly listed, or also include elements inherent to the article or equipment. Without further limitation, an element defined by the phrase "comprises a . . . " may not preclude the presence of additional identical elements in an article or device that includes above-mentioned element.

Above description of disclosed embodiments may enable those skilled in the art to make or use the present disclosure. Various modifications to these embodiments may be readily apparent to those skilled in the art, and generic principles defined herein may be implemented in other embodiments without departing from the spirit or scope of the present disclosure. Therefore, the present disclosure may not be limited according to embodiments in the present disclosure but may be consistent with the widest scope of the principles and novelty features disclosed in the present disclosure.

What is claimed is:

1. A shift register, comprising:
   an input module, configured to output a first control signal according to an input signal;
   a pull-down control module, configured to control a potential of a first node according to a first clock signal, a high-level signal, a low-level signal, and the first control signal;
   a pull-up control module, configured to control a potential of a second node according to the first clock signal, a second clock signal, the high-level signal, and the first control signal;
   a maintaining module, configured to pull down the potential of the first node according to the input signal, the first clock signal, the second clock signal, and the low-level signal;
   a pull-down output module, configured to control an output terminal of the shift register to output the low-level signal according to the potential of the first node; and
   a pull-up output module, configured to control the output terminal of the shift register to output the high-level signal according to the potential of the second node,
   wherein the maintaining module is configured to control a potential of a third node inside the maintaining module according to the input signal, the first clock signal, the second clock signal and the low-level signal, and the maintaining module includes:
   a first switch transistor, wherein both a gate electrode and a first electrode of the first switch transistor are directly connected to the third node, and a second electrode of the first switch transistor is directly connected to the first node that is different from the third node and is located outside the maintaining module;
   a second switch transistor, wherein a gate electrode of the second switch transistor is configured for an input of the second clock signal, and a first electrode of the second switch transistor is configured for an input of the input signal;
   a third switch transistor, wherein a gate electrode of the third switch transistor is configured for an input of the low-level signal, a first electrode of the third switch transistor is connected to a second electrode of the second switch transistor, and a second electrode of the third switch transistor is connected to the third node; and
   a first capacitor, wherein one electrode plate of the first capacitor is configured for an input of the first clock signal, and the other electrode plate of the first capacitor is connected to the third node.

2. The shift register according to claim 1, wherein:
the pull-down control module is connected between an output terminal of the input module and the first node;
the pull-up control module is connected between the output terminal of the input module and the second node;
the pull-up control module is connected to the pull-down control module; and
the maintaining module is connected to the first node.

3. The shift register according to claim 1, wherein:
when an output signal jumps from the high-level signal to the low-level signal, the potential of the first node is pulled down through coupling between the output terminal of the shift register and the first node, such that the output terminal of the shift register outputs the low-level signal; after the output terminal of the shift register outputs the low-level signal, the potential of the third node is pulled down through coupling between a first capacitor and the third node, such that by pulling down the potential of the first node through the potential of the third node, the output terminal of the shift register is maintained to output the low-level signal.

4. The shift register according to claim 1, wherein the pull-down control module includes:
a fourth switch transistor, wherein a gate electrode of the fourth switch transistor is connected to a fourth node, and a first electrode of the fourth switch transistor is configured for an input of the high-level signal;
a fifth switch transistor, wherein a gate electrode of the fifth switch transistor is configured for an input of the first clock signal, a first electrode of the fifth switch transistor is connected to a second electrode of the fourth switch transistor, a second electrode of the fifth switch transistor is connected to a fifth node, and the input module outputs the first control signal through the fifth node;
a sixth switch transistor, wherein a gate electrode of the sixth switch transistor is configured for an input of the second clock signal, a first electrode of the sixth switch transistor is connected to the fourth node, and a second electrode of the sixth switch transistor is configured for an input of the low-level signal; and
a seventh switch transistor, wherein a gate electrode of the seventh switch transistor is configured for the input of the low-level signal, a first electrode of the seventh switch transistor is connected to the fifth node, and a second electrode of the seventh switch transistor is connected to the first node.

5. The shift register according to claim 1, wherein the pull-up control module includes:
an eighth switch transistor, wherein a first electrode of the eighth switch transistor is connected to a fourth node, a second electrode of the eighth switch transistor is configured for an input of the second clock signal, a gate electrode of the eighth switch transistor is connected to a fifth node, and the input module outputs the first control signal through the fifth node;
a ninth switch transistor, wherein a gate electrode of the ninth switch transistor is configured for an input of the low-level signal, and a first electrode of the ninth switch transistor is connected to the fourth node;
a tenth switch transistor, wherein a gate electrode of the tenth switch transistor is configured for an input of the first clock signal, a first electrode of the tenth switch transistor is connected to a second electrode of the ninth switch transistor through a second capacitor, and a second electrode of the tenth switch transistor is connected to the second node;
an eleventh switch transistor, wherein a gate electrode of the eleventh switch transistor is connected to the second electrode of the ninth switch transistor, the gate electrode of the eleventh switch transistor is connected to a first electrode of the eleventh switch transistor through the second capacitor, the first electrode of the eleventh switch transistor is connected to the first electrode of the tenth switch transistor, and a second electrode of the eleventh switch transistor is configured for the input of the first clock signal; and
a twelfth switch, wherein a gate electrode of the twelfth switch is connected to the fifth node, a first electrode of the twelfth switch is configured for an input of the high-level signal, and a second electrode of the twelfth switch is connected to the second node.

6. The shift register according to claim 1, wherein:
the pull-down output module includes a thirteenth switch transistor, wherein a gate electrode of the thirteenth switch transistor is connected to the first node, and a first electrode of the thirteenth switch transistor is connected to the output terminal of the shift register, and a second electrode of the thirteenth switch transistor is configured for an input of the low-level signal.

7. The shift register according to claim 1, wherein the pull-up module includes:
a fourteenth switch transistor, wherein a gate electrode of the fourteenth switch transistor is connected to the second node, a first electrode of the fourteenth switch transistor is configured for an input of the high-level signal, and a second electrode of the fourteenth switch transistor is connected to the output terminal of the shift register; and
and a third capacitor, connected between the gate electrode and the first electrode of the fourteenth switch transistor.

8. The shift register according to claim 1, wherein:
the input module includes a fifteenth switch transistor, wherein a gate electrode of the fifteenth switch transistor is configured for an input of the second clock signal, a first electrode of the fifteenth switch transistor is configured to output the first control signal, and a second electrode of the fifteenth switch transistor is connected to the maintaining module and configured for an input of the input signal.

9. The shift register according to claim 1, wherein:
each of the input module, the pull-down control module, the pull-up control module, the maintaining module, the pull-down output module, and the pull-up output module includes at least one switch transistor; and each switch transistor is a PMOS (p-channel metal oxide semiconductor).

10. A display drive method of a display panel, wherein the display panel includes a sub-pixel and a pixel circuit connected to the sub-pixel, the method comprising:
outputting a scan signal through a shift register, wherein the shift register includes:
an input module, configured to output a first control signal according to an input signal;
a pull-down control module, configured to control a potential of a first node according to a first clock signal, a high-level signal, a low-level signal, and the first control signal;
a pull-up control module, configured to control a potential of a second node according to the first clock signal, a second clock signal, the high-level signal, and the first control signal;

a maintaining module, configured to pull down the potential of the first node according to the input signal, the first clock signal, the second clock signal, and the low-level signal;

a pull-down output module, configured to control an output terminal of the shift register to output the low-level signal according to the potential of the first node; and a pull-up output module, configured to control the output terminal of the shift register to output the high-level signal according to the potential of the second node, wherein the maintaining module is configured to control a potential of a third node inside the maintaining module according to the input signal, the first clock signal, the second clock signal and the low-level signal, and the maintaining module includes:

a first switch transistor, wherein both a gate electrode and a first electrode of the first switch transistor are directly connected to the third node, and a second electrode of the first switch transistor is directly connected to the first node that is different from the third node and is located outside the maintaining module;

a second switch transistor, wherein a gate electrode of the second switch transistor is configured for an input of the second clock signal, and a first electrode of the second switch transistor is configured for an input of the input signal;

a third switch transistor, wherein a gate electrode of the third switch transistor is configured for an input of the low-level signal, a first electrode of the third switch transistor is connected to a second electrode of the second switch transistor, and a second electrode of the third switch transistor is connected to the third node; and a first capacitor, wherein one electrode plate of the first capacitor is configured for an input of the first clock signal, and the other electrode plate of the first capacitor is connected to the third node; and controlling the pixel circuit to generate a drive current according to the scan signal, thereby controlling the sub-pixel to perform light-emitting display.

11. The display drive method according to claim 10, wherein outputting the scan signal through the shift register includes:

when an output signal jumps from the high-level signal to the low-level signal, pulling down the potential of the first node through coupling between the output terminal of the shift register and the first node, such that the output terminal of the shift register outputs the low-level signal; and after the output terminal of the shift register outputs the low-level signal, pulling down the potential of a third node through coupling between a first capacitor and the third node, such that by pulling down the potential of the first node through the potential of the third node, the output terminal of the shift register is maintained to output the low-level signal.

12. The display drive method according to claim 11, wherein:

in a 6th time-segment, the input signal is turned off, the first clock signal is turned off, the second clock signal is turned on, the output signal of the output terminal of the shift register starts to decrease from the high-level signal, the output terminal of the shift register is coupled with the first node, the potential of the first node is pulled down, such that the output terminal of the shift register outputs the low-level signal; and a turn-off potential of the input signal is written into the third node through the first switch transistor and the second switch transistor, such that the third switch transistor is turned off.

13. A display drive method of a display panel, wherein the display panel includes a sub-pixel and a pixel circuit connected to the sub-pixel the method comprising:

outputting a scan signal through a shift register, wherein the shift register includes:

an input module, configured to output a first control signal according to an input signal;

a pull-down control module, configured to control a potential of a first node according to a first clock signal, a high-level signal, a low-level signal, and the first control signal;

a pull-up control module, configured to control a potential of a second node according to the first clock signal, a second clock signal, the high-level signal, and the first control signal;

a maintaining module, configured to pull down the potential of the first node according to the input signal, the first clock signal, the second clock signal, and the low-level signal;

a pull-down output module, configured to control an output terminal of the shift register to output the low-level signal according to the potential of the first node; and a pull-up output module, configured to control the output terminal of the shift register to output the high-level signal according to the potential of the second node; and controlling the pixel circuit to generate a drive current according to the scan signal, thereby controlling the sub-pixel to perform light-emitting display, wherein outputting the scan signal through the shift register includes:

when an output signal jumps from the high-level signal to the low-level signal, pulling down the potential of the first node through coupling between the output terminal of the shift register and the first node, such that the output terminal of the shift register outputs the low-level signal; and after the output terminal of the shift register outputs the low-level signal, pulling down the potential of a third node through coupling between a first capacitor and the third node, such that by pulling down the potential of the first node through the potential of the third node, the output terminal of the shift register is maintained to output the low-level signal, wherein:

a time sequence period of the input signal includes time-segments from a 1st time-segment to a 9th time-segment according to a time sequence, wherein time-segments from a 2nd time-segment to a 4th time-segment form a turn-on time-segment of the input signal, and other time-segments form a turn-off time-segment of the input signal; and a period of the first clock signal is same as a period of the second clock signal; the first clock signal is turned on in a (2i−1)th time-segment of the input signal and turned off in a (2i)th time-segment of the input signal; and the second clock signal is turned on in the (2i)th time-segment of the input signal and turned off in the (2i−1)th time-segment of the input signal.

\* \* \* \* \*